(12) United States Patent  
Nakashiba

(10) Patent No.: US 8,471,261 B2  
(45) Date of Patent: Jun. 25, 2013

(54) SOLID-STATE IMAGE PICKUP DEVICE

(75) Inventor: Yasutaka Nakashiba, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 66 days.

(21) Appl. No.: 11/774,726

(22) Filed: Jul. 9, 2007

(65) Prior Publication Data

US 2008/0006893 A1 Jan. 10, 2008

(30) Foreign Application Priority Data

Jul. 10, 2006 (JP) .................................. 2006-188904

(51) Int. Cl.  
*H01L 29/04* (2006.01)  
*H01L 29/10* (2006.01)

(52) U.S. Cl.  
USPC ............... 257/72; 257/59; 257/226; 257/440; 257/E31.001; 257/E31.054

(58) Field of Classification Search  
USPC .............. 257/291, 225, 79, 462, 59.72, 226, 257/440, 292, 290, 461, 460, E31.001, E31.054, 257/59, 72, 432, 447; 348/294; 428/408; 382/124; 250/208.01  
See application file for complete search history.

(56) References Cited

U.S. PATENT DOCUMENTS

| | | | |
|---|---|---|---|
| 6,169,319 B1 * | 1/2001 | Malinovich et al. | 257/447 |
| 6,429,036 B1 * | 8/2002 | Nixon et al. | 438/57 |
| 6,483,129 B2 * | 11/2002 | Rhodes et al. | 257/185 |
| 6,593,607 B1 * | 7/2003 | Hseih | 257/292 |
| 6,639,293 B2 * | 10/2003 | Furumiya et al. | 257/462 |
| 6,756,121 B2 * | 6/2004 | Forsythe et al. | 428/408 |
| 6,829,375 B1 | 12/2004 | Higuchi | |
| 7,030,919 B2 | 4/2006 | Ohkubo et al. | |
| 7,425,460 B2 * | 9/2008 | Pain | 438/29 |
| 7,452,742 B2 * | 11/2008 | Kanbe | 438/57 |
| 7,638,852 B2 * | 12/2009 | Hsu et al. | 257/432 |
| 7,701,029 B2 | 4/2010 | Mabuchi | |
| 7,791,170 B2 * | 9/2010 | Chiang et al. | 257/549 |

(Continued)

FOREIGN PATENT DOCUMENTS

| | | |
|---|---|---|
| JP | 1-274468 | 11/1989 |
| JP | 7-211882 | 8/1995 |

(Continued)

OTHER PUBLICATIONS

S.M. Sze. Semiconductor Devices. Physics and Teachnology, 2nd Edition, 2002, John Wiley and Sons, Inc., 564 p.*

(Continued)

*Primary Examiner* — Colleen Matthews  
*Assistant Examiner* — Galina Yushina  
(74) *Attorney, Agent, or Firm* — Young & Thompson

(57) ABSTRACT

A solid-state image pickup device 1 is back surface incident type and includes a semiconductor substrate 10, a semiconductor layer 20 and a light receiving unit 30. The solid-state image pickup device 1 photoelectrically converts light incident on the back surface S2 of the semiconductor substrate 10 into signal electrical charges to image an object. The semiconductor substrate 10 has a resistivity ρ1. A semiconductor layer 20 is provided on the surface S1 of the semiconductor substrate 10. The semiconductor layer 20 has a resistivity ρ2. Where, ρ2>ρ1. A light receiving unit 30 is formed in the semiconductor layer 20. The light receiving unit 30 receives signal charges produced by the photoelectric conversion.

20 Claims, 5 Drawing Sheets

U.S. PATENT DOCUMENTS

| | | | |
|---|---|---|---|
| 7,795,676 B2 | 9/2010 | Mabuchi | |
| 8,084,286 B2 | 12/2011 | Kanbe | |
| 2002/0005906 A1* | 1/2002 | Ohkubo et al. | 348/294 |
| 2002/0063302 A1* | 5/2002 | Furumiya et al. | 257/432 |
| 2006/0055799 A1 | 3/2006 | Ohkubo et al. | |
| 2006/0125038 A1* | 6/2006 | Mabuchi | 257/447 |

FOREIGN PATENT DOCUMENTS

| | | |
|---|---|---|
| JP | 11-204752 | 7/1999 |
| JP | 2000217803 | 8/2000 |
| JP | 2002033469 | 1/2002 |
| JP | 2003-338615 | 11/2003 |
| JP | 2006-19360 | 1/2006 |
| JP | 2006-173351 | 6/2006 |

OTHER PUBLICATIONS

Sze, Semiconductor Devices Physics and Technology, John Wiley & Sons, 2nd edition, 2002, p. 55.*

Sze, Semiconductor Devices. Physics and Technology, 2nd edition, 2002, p. 55.*

Japanese Office Action dated Nov. 1, 2011 in corresponding Japanese Application No. 2006-188904 with English translation of Japanese Office Action.

Notification of Reasons for Refusal issued Jan. 24, 2012 by the Japanese Patent Office in corresponding Japanese Application No. 2006-188904 with English translation.

* cited by examiner

SOLID-STATE IMAGE PICKUP DEVICE

BACKGROUND OF THE INVENTION

1. Field of the Invention

The present invention relates to a solid-state image pickup device.

2. Description of the Related Art

Japanese Patent Laid-Open No. 2002-33469 describes a back surface incident type of solid-state image pickup device. In the solid-state image pickup device, light incident on the back surface of a semiconductor substrate from an object is photoelectrically converted inside the semiconductor substrate. Electric charges produced by the conversion are received by a light receiving unit to image the object.

Japanese Patent Laid-Open No. 2000-217803 in addition to Japanese Patent Laid-Open No. 2002-33469 is known as a prior art document related to the present invention.

The present inventor has recognized as follows. The solid-state image pickup device described in Japanese Patent Laid-Open No. 2002-33469 leaves room for improvement in terms of easy release of excess charges. In this respect, the resistivity of the whole substrate needs to be reduced to easily release excess charges. This, however, makes it difficult to directly use a platform in an existing device process without modification when a light receiving unit is formed in the substrate.

SUMMARY

According to one aspect of the present invention, there is provided a solid-state image pickup device photoelectrically converting light incident on a back surface of a semiconductor substrate into signal electric charges to image an object, the solid-state image pickup device comprising: a first semiconductor layer forming a part or whole of the semiconductor substrate and having a first resistivity; a second semiconductor layer provided on a front surface of the semiconductor substrate and having a second resistivity higher than the first resistivity; and a light receiving unit provided in the second semiconductor layer and receiving the signal electric charges produced by the photoelectric conversion.

The solid-state image pickup device is provided with a first semiconductor layer with a relatively lower resistivity (a first resistivity). This enables excess charges to be easily released from the surface of the semiconductor substrate. On the other hand, a second semiconductor layer on which the light receiving unit is provided has a higher resistivity (a second resistivity) than the first semiconductor layer. Unlike the case where both the first and the second semiconductor layer have the first resistivity, a platform in an existing device process can be directly used when a light receiving unit is formed on the second semiconductor substrate.

According to another aspect of the present invention, there is provided a solid-state image pickup device comprising: a first semiconductor layer of first conductivity type having first and second main surface portions; a plurality of diffusion regions of second conductivity type formed in the first main surface portion of the first semiconductor layer; and a second semiconductor layer of said first conductivity type formed over the second main surface portion of the first semiconductor layer and receiving light incident thereon, the second semiconductor layer being lower in resistivity than the first semiconductor layer.

The present invention realizes a solid-state image pickup device which can be easily produced and has a structure capable of easily releasing excess charges.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION OF THE PREFERRED EMBODIMENTS

Figure 1A:
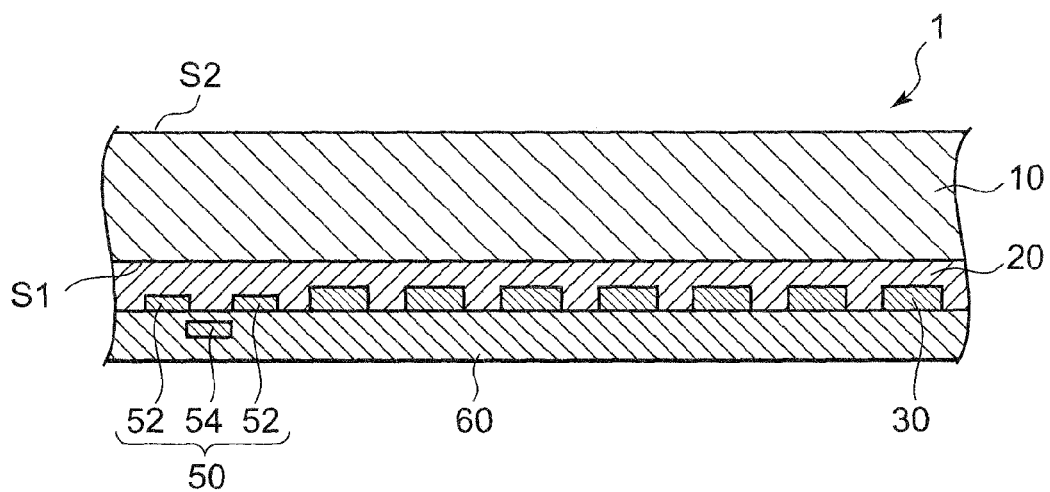
FIGS. 1A and 1B are cross sections illustrating a first embodiment of a solid-state image pickup device according to the present invention.

Preferred embodiments of a solid-state image pickup device according to the present invention are described in detail below with reference to the drawings. In the description of the drawings the same constituent elements are given the same reference numerals to omit duplicated description.

First Embodiment

FIG. 1A is a cross section illustrating a first embodiment of a solid-state image pickup device according to the present invention. A solid-state image pickup device 1 is back surface incident type including a semiconductor substrate 10 (a first semiconductor layer), semiconductor layer 20 (a second semiconductor layer) and light receiving unit 30. The solid-state image pickup device 1 images an object in such a manner that light incident on the back surface S2 of the semiconductor substrate 10 is photoelectrically converted into signal electric charges inside the semiconductor substrate 10 or the semiconductor layer 20.

The semiconductor substrate 10 in the present invention is a $p^+$-type silicon substrate. The semiconductor substrate 10 has a resistivity $\rho 1$ (a first resistivity). The resistivity $\rho 1$ is, for example, 0.01 $\Omega$cm and is preferably $\rho 1 \leq 0.1$ $\Omega$cm. The thickness of the semiconductor substrate 10 is preferably not greater than the absorption length of the above light, that is, of light used in image pickup. If the wavelength of the above light is 1 $\mu$m, for example, the absorption length is approximately 100 $\mu$m.

The semiconductor layer 20 is provided on a front surface S1 of the semiconductor substrate 10. The semiconductor layer 20 in the present invention is a p-type silicon layer. The semiconductor layer 20 has a resistivity $\rho 2$ (a second resistivity). Where, $\rho 2 > \rho 1$. The resistivity $\rho 2$ is, for example, 10 $\Omega$cm. It is preferably that 5 $\Omega$cm $\leq \rho 2 \leq 100$ $\Omega$cm. The semiconductor layer 20 is formed by an epitaxial growth method, for example.

The light receiving unit 30 is formed in the semiconductor layer 20. Specifically, the light receiving unit 30 is provided in the surface layer on the front surface (or, the surface on the opposite side of the semiconductor substrate 10) side of the semiconductor layer 20. The light receiving unit 30 receives signal electric charges produced by the above photoelectric conversion. The light receiving unit 30 in the present invention is an n-type impurity diffusion layer. The light receiving unit 30 and the semiconductor layer 20 adjacent thereto form a photodiode.

A MOSFET 50 is also formed in the semiconductor layer 20. That is to say, the solid-state image pickup device 1 includes a MOS image sensor formed of the light receiving unit 30 and a logic circuit unit formed of the MOSFET 50. The MOSFET 50 includes an n-type impurity diffusion layer 52 functioning as source and drain area and a gate electrode 54.

An interconnect layer 60 is provided on the surface of the semiconductor layer 20. An interconnect (not shown) is formed in the interconnect layer 60.

Figure 1B:
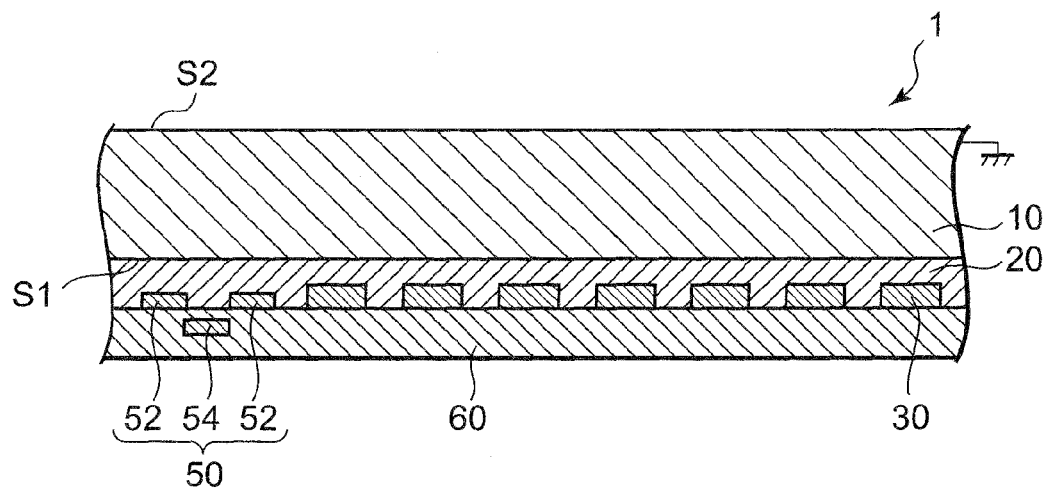
Figure 2A:
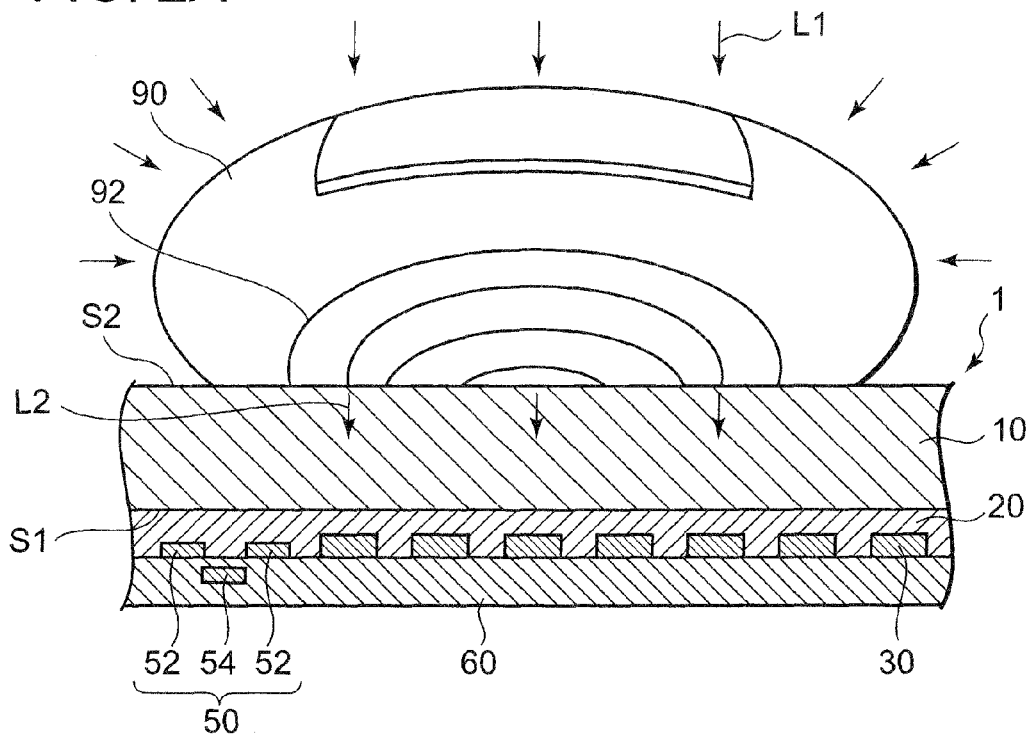
FIGS. 2A and 2B are cross sections describing one example of operation of the solid-state image pickup device in FIG. 1.
Figure 2B:
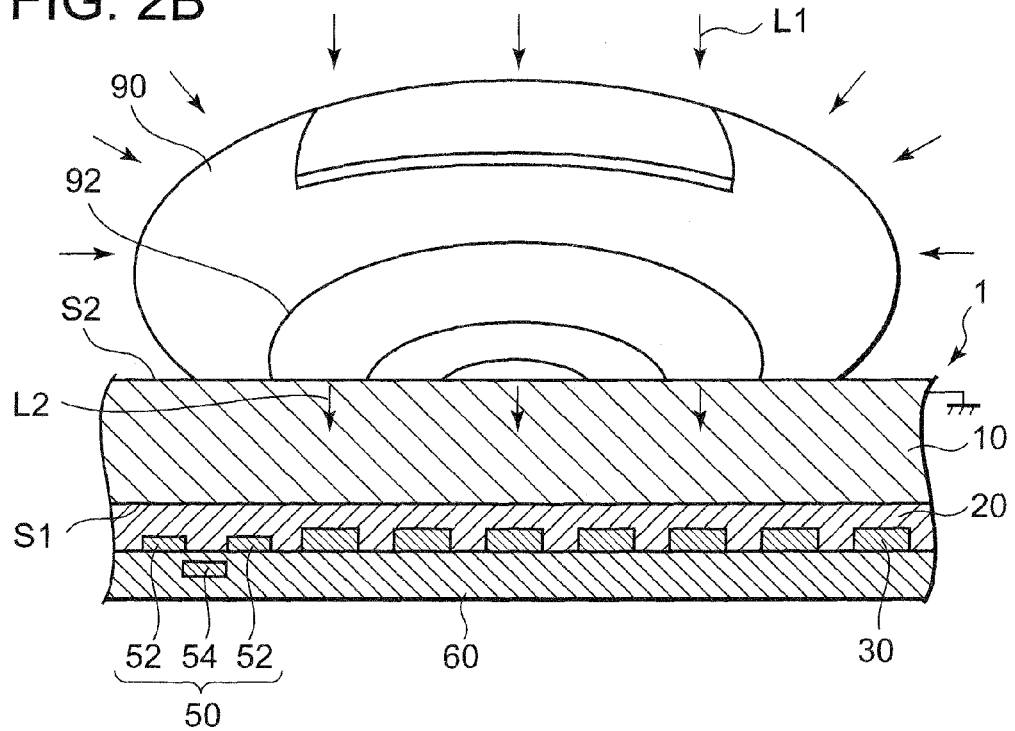

One example of operation of the solid-state image pickup device 1 is described with reference to FIG. 2A. In the figure, a finger 90 being an object to be imaged is brought into contact with the back surface S2 of the semiconductor substrate 10. When light L1 from a light source such as a fluorescent lamp or LED is caused to be incident on a finger 90, a transmitted light L2 is incident on the back surface S2. At that point, the transmitted light L2 includes information on a fingerprint 92 of the finger 90. The transmitted light L2 is photoelectrically converted into signal electric charges inside the semiconductor substrate 10 or the semiconductor layer 20. The light receiving unit 30 receives the signal charges produced by the photoelectric conversion to pick up the image of the fingerprint 92. Incidentally, any of visible light, near infrared light or infrared light may be used as the light L1. A fixed electric potential (for example, ground potential) is preferably applied to the semiconductor substrate 10 while the solid-state image pickup device 1 is operating. FIGS. 1B and 2B illustrate examples where the semiconductor substrate 10 is connected to the ground in FIGS. 1A and 2A.

The effects of the present invention are described below. The semiconductor substrate 10 with a small resistivity $\rho 1$ is provided on the solid-state image pickup device 1. This causes excess charges introduced by electro-static discharge (ESD) when the finger is brought into contact with the back surface S2 to be readily released from the semiconductor substrate 10 connected to the fixed electric potential (for example, ground potential), precluding circuit elements (MOSFET 50 or the like) in the solid-state image pickup device 1 from being electrostatically broken down. If $\rho 1 \leq 0.1$ $\Omega$cm, a marked effect can be obtained.

The semiconductor layer 20 on which the light receiving unit 30 is provided has a higher resistivity $\rho 2$ than that of the semiconductor substrate 10. This enables the platform in an existing device process to be used without modification when the light receiving unit 30 and MOSFET 50 are formed on the semiconductor layer 20, unlike the case where both the semiconductor substrate 10 and the semiconductor layer 20 have the resistivity $\rho 1$. This is because the resistivity $\rho 2$ can be set to a value within an available range of the existing device process because the value of the resistivity $\rho 2$ does not need following the resistivity $\rho 1$ to be reduced. If $5 \, \Omega\text{cm} \leq \rho 2 \leq 100$ $\Omega$cm, it is particularly preferable to use the existing device process without modification. If the existing device process cannot be used, a problem is caused in that a standard logic process is prevented from being used and circuit components such as a standard macro from being used. However, according to the present embodiment, this problem can be avoided.

Part of signal electric charges produced by photoelectric conversion disappears due to recombination before reaching the light receiving unit 30. In this respect, if the thickness of the semiconductor substrate 10 is not greater than the absorption length of the light used for image pickup, the ratio of recombining signal charges can be sufficiently lowered, providing the solid-state image pickup device 1 having extra-high sensitivity.

A fixed electric potential is applied to the semiconductor substrate 10 to allow excess charges to be more easily released. This further suppresses the occurrence of electro-static breakdown.

When the semiconductor layer 20 is formed by the epitaxial growth method, or when the semiconductor layer 20 is formed of an epitaxial layer, the semiconductor layer 20 having a higher resistivity than the semiconductor substrate 10 is easily formed. The resistivity $\rho 1$ of the semiconductor substrate 10 can be sharply changed to the resistivity $\rho 2$ of the semiconductor layer 20.

Second Embodiment

Figure 3A:
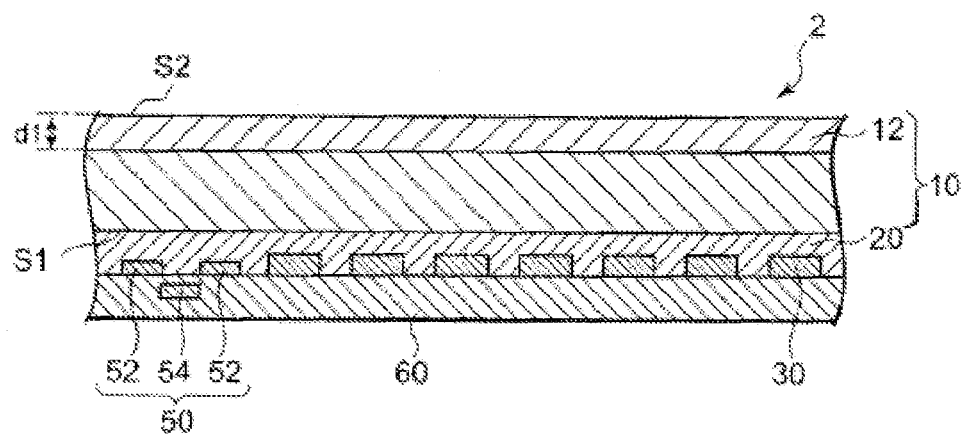
FIGS. 3A and 3B are cross sections illustrating a second embodiment of a solid-state image pickup device according to the present invention.
Figure 3B:
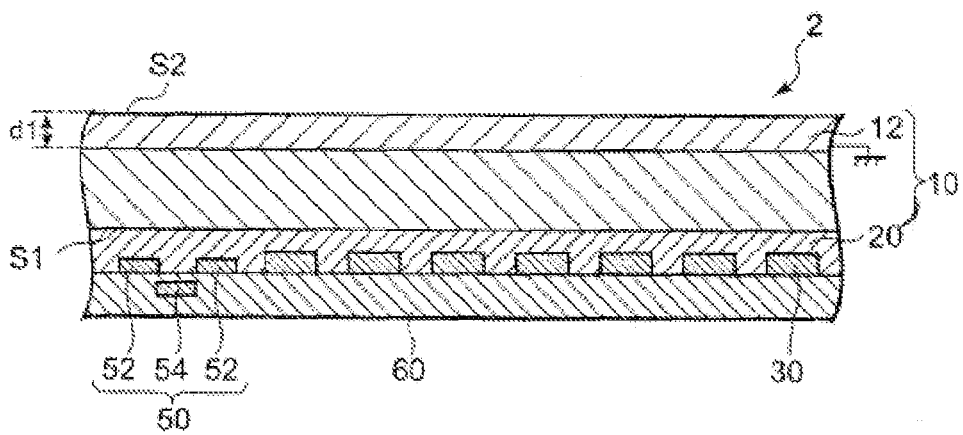

FIG. 3A is a cross section illustrating a second embodiment of a solid-state image pickup device according to the present invention. A solid-state image pickup device 2 is also back surface incident type including a semiconductor substrate 10, semiconductor layer 20 and light receiving unit 30. The solid-state image pickup device 2 is different from the solid-state image pickup device 1 in the configuration of the semiconductor substrate 10. The semiconductor substrate 10 in the solid-state image pickup device 2 is a p-type or p$^-$-type silicon substrate. A p$^+$-type impurity diffusion layer 12 (a first semiconductor layer) is formed on the surface layer on the side of the back surface S2 of the semiconductor substrate 10. The p$^+$-type impurity diffusion layer 12 has the above described resistivity $\rho 1$. That is, the whole of the semiconductor substrate 10 is formed by the first semiconductor layer in the solid-state image pickup device 1, whereas, only part of the semiconductor substrate 10 is formed by the first semiconductor layer in the solid-state image pickup device 2. The resistivity $\rho 1$ of the p$^+$-type impurity diffusion layer 12 is lower than a resistivity $\rho 3$ of semiconductor substrate 10. The resistivity $\rho 3$ of semiconductor substrate 10 may be lower than the resistivity $\rho 2$ of the semiconductor layer 20, or the resistivity $\rho 3$ of semiconductor substrate 10 may be higher than the resistivity $\rho 2$ of the semiconductor layer 20. Other configuration and operation of the solid-state image pickup device 2 are the same as those of the solid-state image pickup device 1. Also in FIG. 3A, a fixed electric potential is preferably applied to the semiconductor substrate 10, it is particularly preferable to apply a fixed electric potential to the p$^+$-type impurity diffusion layer 12. FIG. 3B illustrates an example where the p$^+$-type impurity diffusion layer 12 is connected to the ground.

When the whole semiconductor substrate 10 corresponds to the first semiconductor layer as in the solid-state image pickup device 1, the thickness of the whole semiconductor substrate 10 needs to be reduced from the viewpoint that the ratio of recombining signal charges is lowered as described above. On the other hand, the thickness of the semiconductor substrate 10 needs to be increased from the viewpoint that the strength of the semiconductor substrate 10 or the strength of the solid-state image pickup device is sufficiently secured.

The present embodiment can satisfy these opposing requirements. That is to say, a configuration in which the first semiconductor layer is provided only at part of the semiconductor substrate 10 enables the ratio of recombining signal electric charges to be lowered even if the thickness of the whole semiconductor substrate 10 is increased, as long as the first semiconductor layer is positioned in the vicinity of the back surface S2 of the semiconductor substrate 10. Specifically, it is preferable that a distance d1 between the face of the first semiconductor layer on the side of the semiconductor layer 20 (refer to FIGS. 3A and 3B) and the back surface S2 of the semiconductor substrate 10 is not greater than the absorption length of the light used for image pickup. In the present embodiment, the distance d1 is equal to the thickness of the p$^+$-type impurity diffusion layer 12. Other effects of the solid-state image pickup device 2 are the same as those of the solid-state image pickup device 1.

Figure 4A:
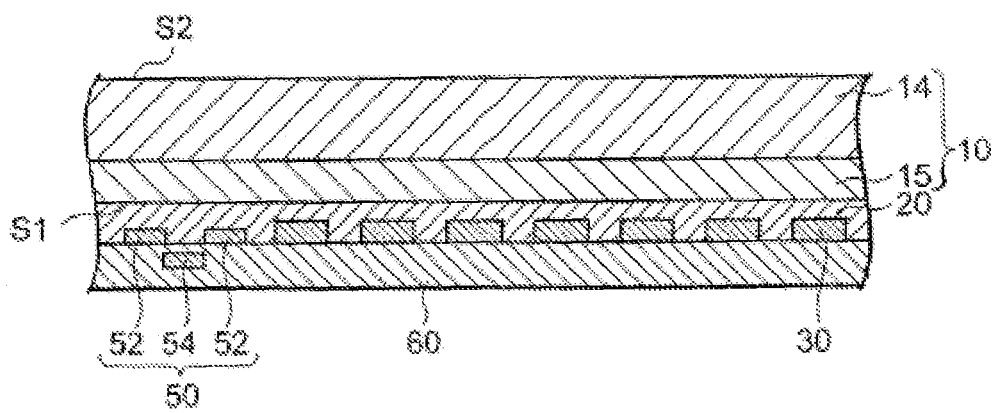
FIGS. 4A and 4B are cross sections illustrating a solid-state image pickup device according to one modification in an embodiment.

The solid-state image pickup device according to the present invention is not limited to the above embodiment, but may be modified in various forms. Various configurations in addition to those illustrated in the above embodiments are possible as the configuration of the semiconductor substrate 10 as long as at least part of the semiconductor substrate 10 is formed by the first semiconductor layer with the resistivity ρ1. For example, as illustrated in FIG. 4A, the semiconductor substrate 10 may include a p$^+$-type silicon substrate 14 corresponding to the first semiconductor layer and an epitaxial layer 15 provided thereon. The epitaxial layer 15 is a p-type or p$^-$-type silicon layer.

Figure 4B:
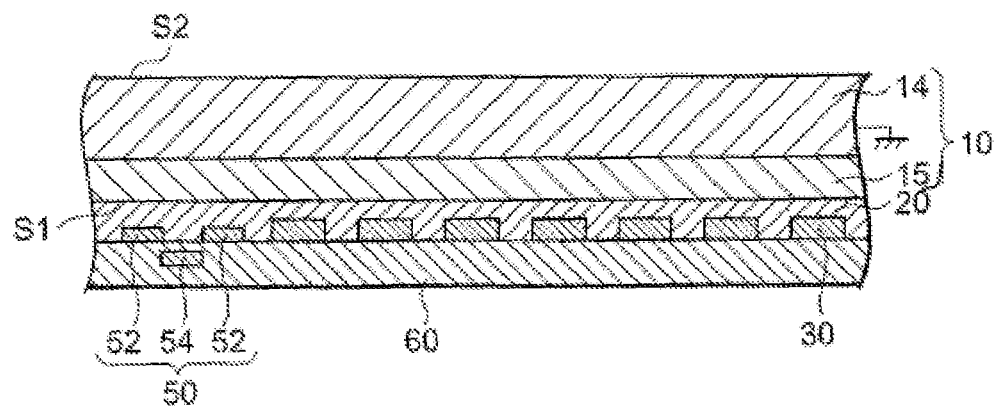
Figure 5A:
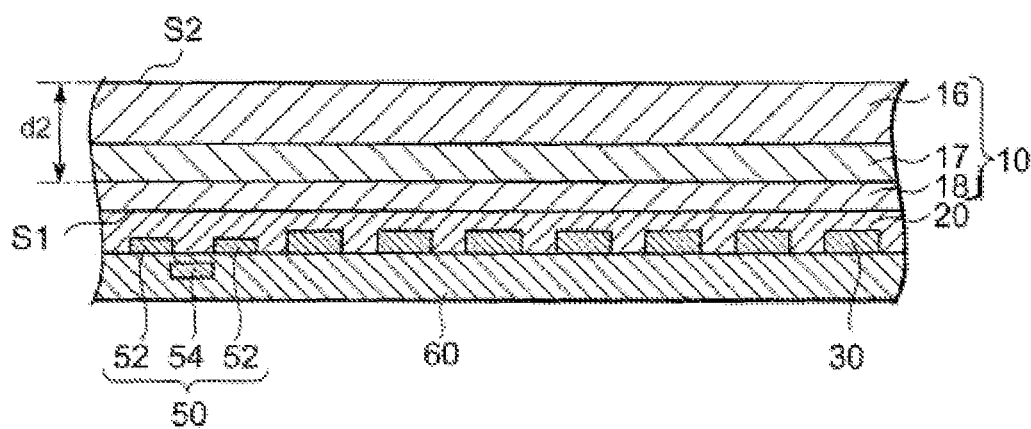
FIGS. 5A and 5B are cross sections illustrating a solid-state image pickup device according to another modification in the embodiment.
Figure 5B:
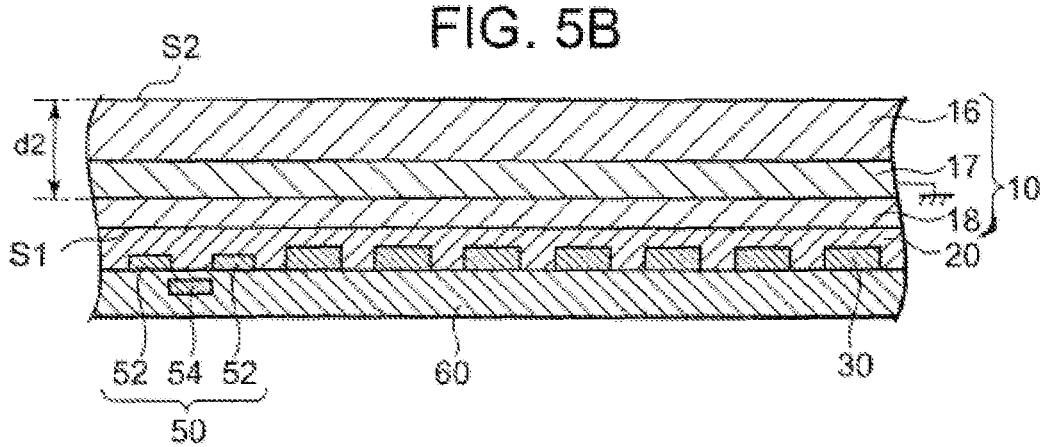

Alternatively, as illustrated in FIG. 5A, the semiconductor substrate 10 may include a silicon substrate 16 and epitaxial layers 17 and 18 deposited thereon in this order. The silicon substrate 16 is of p-type or p$^-$-type. The epitaxial layer 17 is a p$^+$-type silicon layer and corresponds to the first semiconductor layer. The epitaxial layer 18 is a p-type or p$^-$-type silicon layer. That is, the resistivity of the silicon substrate 10 is higher than the resistivity of the epitaxial layer 17, and the resistivity of the epitaxial layer 18 is higher than the resistivity of the epitaxial layer 17. In this case, a distance d2 in FIG. 5A denotes "a distance between the face of the first semiconductor layer on the side of the semiconductor layer 20 and the back surface S2 of the semiconductor substrate 10". In FIG. 5A, the epitaxial layer 18 need not be provided. In that case, the epitaxial layer 17 being the first semiconductor layer is positioned on the surface layer of the semiconductor substrate 10 on the side of a surface S1. Also in FIGS. 4A and 5A, a fixed electric potential is preferably applied to the semiconductor substrate 10, it is particularly preferable to apply a fixed electric potential to the first semiconductor layer (to the p$^+$-type silicon substrate 14 in FIG. 4A and to the epitaxial layer 17 in FIG. 5A). FIG. 4B illustrates an example where the p$^+$-type silicon substrate 14 is connected to the ground in FIG. 4A. FIG. 5B illustrates an example where the epitaxial layer 17 is connected to the ground in FIG. 5A.

Although the above embodiments show examples where the N-channel MOSFET 50 is provided, a P-channel MOSFET may be provided instead of the MOSFET 50 or in addition to the MOSFET 50.

Although the p-type semiconductor substrate, p-type semiconductor layer and n-type light receiving unit are exemplified in the above embodiments, the n-type semiconductor substrate, n-type semiconductor layer and p-type light receiving unit may be used.

A portion excluding the first semiconductor layer in the semiconductor substrate may be a high-resistance semiconductor layer with a resistivity of 1000 Ωcm or more. The portion corresponds to the semiconductor substrate 10 (except the portion where the p$^+$-type impurity diffusion layer 12 is formed) in FIGS. 3A and 3B, the epitaxial layer 15 in FIGS. 4A and 4B and the silicon substrate 16 and the epitaxial layer 18 in FIGS. 5A and 5B.

The present invention can be suitably applied to a charge coupled device (CCD) type of solid-state image pickup device.

It is apparent that the present invention is not limited to the above embodiments, but may be modified and changed without departing from the scope and spirit of the invention.

What is claimed is:

1. A solid-state image pickup device photoelectrically converting light incident on a back surface of a semiconductor substrate into signal electric charges to image an object, the solid-state image pickup device comprising:
    a first semiconductor layer forming a part or whole of said semiconductor substrate and having a first resistivity;
    a second semiconductor layer provided on a front surface of said semiconductor substrate and having a second resistivity higher than said first resistivity; and
    a light receiving unit provided in said second semiconductor layer and receiving said signal electric charges produced by the photoelectric conversion,
    wherein a distance between a face of said first semiconductor layer on side of said second semiconductor layer and said back surface of said semiconductor substrate is not greater than an absorption length of said light used in image pickup, and
    wherein said light is in a range of visible light, and
    wherein a thickness of said first semiconductor layer is thicker than a thickness of said second semiconductor layer.

2. The solid-state image pickup device according to claim 1, wherein said first semiconductor layer forms whole of said semiconductor substrate.

3. The solid-state image pickup device according to claim 1, wherein said second semiconductor layer is an epitaxial layer.

4. The solid-state image pickup device according to claim 1, wherein the first resistivity is 0.1 Ωcm or less.

5. The solid-state image pickup device according to claim 1, wherein said second resistivity is 5 Ωcm or more and 100 Ωcm or less.

6. The solid-state image pickup device according to claim 1, wherein said semiconductor substrate further includes a third semiconductor layer having a third resistivity higher than the first resistivity and a fourth semiconductor layer having a fourth resistivity higher than the first resistivity, and the first semiconductor layer is interposed between said third semiconductor layer and said fourth semiconductor layer.

7. The solid-state image pickup device according to claim 1, wherein a logic circuit is formed over said second semiconductor layer and said logic circuit has a MOSFET.

8. The solid-state image pickup device according to claim 1, wherein a predetermined fixed electric potential is applied to said semiconductor substrate.

9. The solid-state image pickup device according to claim 8, wherein said fixed electric potential is ground potential.

10. The solid-state image pickup device according to claim 1, wherein said first semiconductor layer forms a part of said semiconductor substrate.

11. The solid-state image pickup device according to claim 10, wherein said first semiconductor layer is an impurity diffusion layer formed on the surface layer on side of said back surface of said semiconductor substrate.

12. The solid-state image pickup device according to claim 10, wherein said semiconductor substrate includes a silicon substrate corresponding to said first semiconductor layer and an epitaxial layer provided on said silicon substrate.

13. The solid-state image pickup device according to claim 10, wherein the semiconductor substrate includes a silicon substrate and an epitaxial layer being provided on the silicon substrate and corresponding to said first semiconductor layer.

14. A solid-state image pickup device comprising:
a first semiconductor layer of first conductivity type having first and second main surface portions;
a plurality of diffusion regions of second conductivity type formed in said first main surface portion of said first semiconductor layer; and
a second semiconductor layer of said first conductivity type formed over said second main surface portion of said first semiconductor layer and receiving light incident thereon, said second semiconductor layer being lower in resistivity than said first semiconductor layer,
wherein a thickness of said second semiconductor layer is not greater than an absorption length of said light used in image pickup, and
wherein said light is in a range of visible light, and
wherein a thickness of said first semiconductor layer is thicker than a thickness of said second semiconductor layer.

15. The solid-state image pickup device according to claim 14, further comprising a third semiconductor layer of said first conductivity type inserted between said first and second semiconductor layer, said second semiconductor layer being lower in resistivity than said third semiconductor layer.

16. The solid-state image pickup device according to claim 15, wherein said third semiconductor layer being lower in resistivity than said first semiconductor layer.

17. The solid-state image pickup device according to claim 15, wherein said third semiconductor layer being higher in resistivity than said first semiconductor layer.

18. A solid-state image pickup device photoelectrically converting light incident on a back surface of a semiconductor substrate into signal electric charges to image an object, the solid-state image pickup device, comprising:
a first semiconductor layer forming a part or whole of said semiconductor substrate and having a first resistivity;
a second semiconductor layer provided on a front surface of said semiconductor substrate and having a second resistivity higher than said first resistivity; and
a light receiving unit provided in said second semiconductor layer and receiving said signal electric charges produced by the photoelectric conversion,
wherein a distance between a face of said first semiconductor layer on side of said second semiconductor layer and said back surface of said semiconductor substrate is not greater than an absorption length of said light used in image pickup, and
wherein a thickness of said first semiconductor layer is thicker than a thickness of said second semiconductor layer.

19. A solid-state image pickup device comprising:
a first semiconductor layer of first conductivity type having first and second main surface portions;
a plurality of diffusion regions of second conductivity type formed in said first semiconductor layer; and
a second semiconductor layer of said first conductivity type formed over said second main surface portion of said first semiconductor layer and receiving light incident thereon, said second semiconductor layer being lower in resistivity than said first semiconductor layer,
wherein a thickness of said second semiconductor layer is not greater than an absorption length of said light used in image pickup, and
wherein a thickness of said first semiconductor layer is thicker than a thickness of said second semiconductor layer.

20. A solid-state image pickup device photoelectrically converting light incident on a back surface of a semiconductor substrate into signal electric charges to image an object, the solid-state image pickup device comprising:
a first semiconductor layer forming at least a part of said semiconductor substrate and having a first resistivity, said semiconductor substrate configured to photoelectrically convert said light incident thereon into signal electric charges, wherein said light being converted is in a range of visible light;
a second semiconductor layer provided on a front surface of said semiconductor substrate and having a second resistivity higher than said first resistivity, a thickness of said first semiconductor layer being thicker than a thickness of said second semiconductor layer;
a logic circuit having a MOSFET, the logic circuit formed over said second semiconductor layer; and
a light receiving unit provided in said second semiconductor layer and receiving said signal electric charges produced by the photoelectric conversion,
wherein a distance between a face of said first semiconductor layer on side of said second semiconductor layer and said back surface of said semiconductor substrate is not greater than an absorption length of said visible light.

* * * * *